United States Patent
Caldwell

(10) Patent No.: US 6,765,806 B1
(45) Date of Patent: Jul. 20, 2004

(54) COMPOSITION WITH EMC SHIELDING CHARACTERISTICS

(75) Inventor: Barry Caldwell, Hesston, KS (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/879,783

(22) Filed: Jun. 12, 2001

(51) Int. Cl.[7] .......................... H05K 9/00; H01B 1/02
(52) U.S. Cl. ...................... 361/816; 361/818; 252/513
(58) Field of Search .................. 361/816, 818, 361/800, 697, 760, 761, 702, 703, 704–709; 257/783; 438/118, 119; 174/32, 35 R, 35 C, 35 MS; 252/62.55, 512, 513

(56) References Cited

U.S. PATENT DOCUMENTS

| | | | | |
|---|---|---|---|---|
| 2,343,630 A | * | 3/1944 | Atwood, Jr. ................. | 313/479 |
| 5,591,034 A | * | 1/1997 | Ameen et al. ................ | 439/91 |
| 5,615,086 A | * | 3/1997 | Collins et al. .............. | 361/704 |
| 5,621,615 A | * | 4/1997 | Dawson et al. ............. | 361/704 |
| 5,785,913 A | * | 7/1998 | Clark, Jr. et al. ........... | 264/109 |
| 5,847,929 A | * | 12/1998 | Bernier et al. .............. | 361/719 |
| 5,938,979 A | * | 8/1999 | Kambe et al. ............... | 252/500 |
| 5,969,947 A | * | 10/1999 | Johnson et al. ............. | 361/704 |
| 6,011,307 A | * | 1/2000 | Jiang et al. ................. | 257/746 |
| 6,025,651 A | * | 2/2000 | Nam ........................... | 257/788 |
| 6,048,601 A | * | 4/2000 | Yahagi et al. .......... | 174/35 MS |
| 6,051,156 A | * | 4/2000 | Yoshida et al. .......... | 252/62.54 |
| 6,069,023 A | * | 5/2000 | Bernier et al. .............. | 438/107 |
| 6,097,602 A | * | 8/2000 | Witchger ..................... | 361/705 |
| 6,212,074 B1 | * | 4/2001 | Gonsalves et al. ............ | 361/17 |
| 6,259,158 B1 | * | 7/2001 | Usami ......................... | 257/724 |
| 6,327,145 B1 | * | 12/2001 | Lian et al. ................... | 361/697 |
| 2001/0045826 A1 | * | 11/2001 | Schneider .............. | 324/207.17 |

* cited by examiner

Primary Examiner—Evan Pert
Assistant Examiner—Thanh Y. Tran
(74) Attorney, Agent, or Firm—Suiter-West PC LLO

(57) ABSTRACT

The present invention is directed to a composition with electromagnetic compatibility (EMC) characteristics. In an aspect of the present invention, an adhesive suitable to provide a bond between components may include an adhering material suitable for holding a first surface and a second surface in contact. A plurality of items is disposed in the adhering material. The plurality of items has electromagnetic capability shielding characteristics.

23 Claims, 5 Drawing Sheets

US 6,765,806 B1

COMPOSITION WITH EMC SHIELDING CHARACTERISTICS

FIELD OF THE INVENTION

The present invention generally relates to the field of electronic components, and particularly to a composition with EMC shielding characteristics.

BACKGROUND OF THE INVENTION

As electronics have proliferated, the speed of the systems has increased while the space in which the systems are provided has decreased. For example, system performance that was only available in a personal computer tower systems of yesterday may now be found in hand-held devices today. The inclusion of these components in a limited space may cause one component to interfere with another component.

Additionally, modem electronic systems encounter many electromagnetic compatibility (EMC) effects, including electromagnetic interference (EMI). For example, noisy systems may interfere with nearby external components, such as displays, communications systems, and the like. Additionally, systems may be susceptible to external effects such as electrostatic discharge, lightning, and the like. Even internal EMC effects may be encountered due to such things as crosstalk, ground bounce, power disturbances, and the like.

Further, as the speed of components has increased, the resulting heat generated by the components has also increased. This heat may damage not only the component itself, but also the components surrounding the heat-generating component. Such a problem may be further magnified by the smaller sizes of electronic devices encountered today, as the components are more closely packed together.

Therefore, it would be desirable to provide a composition with electromagnetic compatibility (EMC) characteristics.

SUMMARY OF THE INVENTION

Accordingly, the present invention is directed to a composition with electromagnetic compatibility (EMC) characteristics. In a first aspect of the present invention, an adhesive suitable to provide a bond between components includes an adhering material suitable for holding a first surface and a second surface in contact. A plurality of items is disposed in the adhering material. The plurality of items has electromagnetic capability shielding characteristics.

In a second aspect of the present invention, an electrical system includes a first electrical component and a second component suitable for providing a function. The first electrical component includes a first surface and the second component includes a second surface. An adhering material suitable for holding the first surface of the first electrical component and a second surface of the second component in contact is included. A plurality of items is disposed in the adhering material, the plurality of items having electromagnetic capability (EMC) shielding characteristics.

In a third aspect of the present invention, an electrical system includes a first electrical component suitable for providing a function and a second component. The electrical component includes a first surface and the second component includes a second surface. A carrier material is disposed between the first electrical component and the second component. A plurality of items is disposed in the carrier material, the plurality of items having electromagnetic capability (EMC) shielding characteristics.

It is to be understood that both the forgoing, general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 5G, exemplary embodiments of the present invention are shown. Modern electronic systems encounter many electromagnetic compatibility (EMC) effects, including electromagnetic interference (EMI). Additionally, systems may be susceptible to external effects such as electrostatic discharge, lightning, and the like. Even internal EMC effects may be encountered due to such things as crosstalk, ground bounce, power disturbances, and the like. However, by providing a composition, such as an adhesive, conductant, lubricant, and the like, with desired EMC characteristics, such problems may be minimized and reduced, thereby permitting closer component proximity, smaller systems, and the like.

Figure 1:
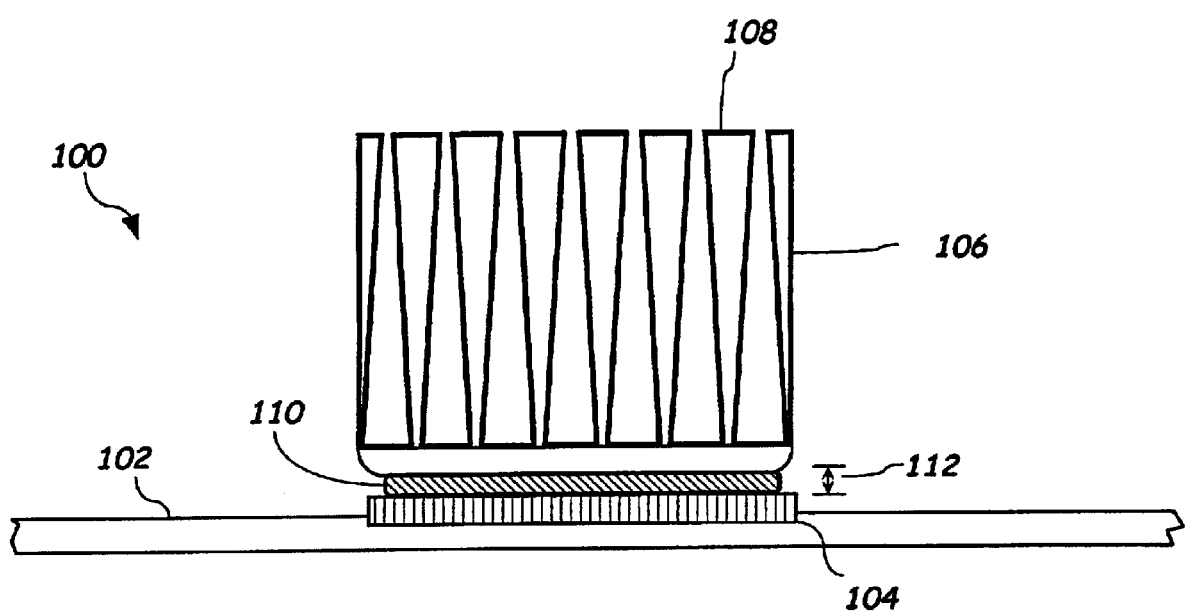
FIG. 1 is an illustration of an exemplary embodiment of the present invention wherein a computer chip utilizes a heat sink attached to the computer chip with an adhesive to provide cooling.

Referring now to FIG. 1, an embodiment 100 of the present invention is shown wherein a computer chip utilizes a heat sink attached to the computer chip with an adhesive to provide cooling. A substrate 102 includes a computer chip 104, such as an integrated circuit, controller, processor, and the like, disposed thereon. In operation, the computer chip 104 may generate heat, which may cause damage not only to the chip itself, but to other components surrounding the chip. Therefore, to dissipate the generated heat, a heat sink 106 is provided.

A heat sink 106 is a component that absorbs and dissipates heat produced by components, such as an electrical component, to prevent overheating. Heat sinks are typically made of a thermally conductive material, such as a metal, and often include fins 108 to assist in transferring heat to the atmosphere. To attach the heat sink 106 to the computer chip 104, an adhesive 110 is provided. Typically, the adhesive 110 is thermally conductive to enable heat to be transferred from the computer chip 104 to the heat sink 106. Additionally, the adhesive 110 provides better contact between the computer chip 104 and the heat sink 106, and enables more secure mounting of the heat sink 106 than using direct attachment of the heat sink 106 to the substrate 102 itself.

However, during operation of the computer chip 104, electromagnetic capability (EMC) issues may arise. EMC is a super set of electromagnetic interference (EMI). For instance, EMC also includes susceptibility and immunity issues along with electrostatic discharge (ESD) issues and additional voltage and current influenced actions. These electromagnetic capability issues may affect not only the chip itself, but also the surrounding components. For example, an information handling system, such as a personal computer, convergence system, information appliance, Internet appliance, personal digital assistant, and the like, may include components such as network connection devices, computer chips, video components, and the like, which may be effected by the electromagnetic capability (EMC) issues of the computer chip 104. However, by providing an adhesive 110 with EMC shielding characteristics, these problems may be reduced.

The adhesive may include a material that provides EMC suppression. For instance, ceramic ferromagnetic materials, such as ferrites, and Mu metals may be provided to shield the computer chip 104, both from affecting surrounding components, as well as being affected by the surrounding components. For instance, ferrite shielding helps control and mitigate the actions and influences that these electrical forces may cause. For example, ferrites, such as the ferrites supplied by the Steward Corporation, and Mu metals, such as the Mu metals (such as magnetic shielding alloys) from ASC Scientific and Ed Fagan Incorporated, may provide high frequency noise suppression performance due to the frequency dependent complex impedance nature of the material. Additionally, ferrites may provide significant EMI reduction while remaining transparent to normal circuit operation.

Figure 2A:
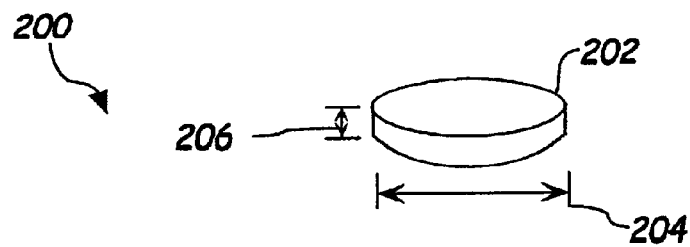
FIG. 2A is an illustration of an embodiment of the present invention wherein an item suitable for inclusion in an adhesive to provide electromagnetic capability shielding characteristics is shown.

Referring now to FIG. 2A, an embodiment 200 of the present invention is shown wherein an item suitable for inclusion in an adhesive to provide electromagnetic capability shielding characteristics is shown. EMC suppression material may be formed as an item for inclusion in an adhesive to provide shielding. For example, an item may be formed as a disk 202. In exemplary embodiments, the disk 202 may range in length 204 from approximately 3 microns to one millimeter. The disk 202 is preferable formed to have a thickness 206 sufficient to float in an adhesive. Further, the material utilized to form the item may be chosen to supply a particular EMC characteristic. Moreover, a plurality of disks may be included in an adhesive to supply a desired EMC characteristic, such as shielding, particular impedance, and the like.

Figure 2B:
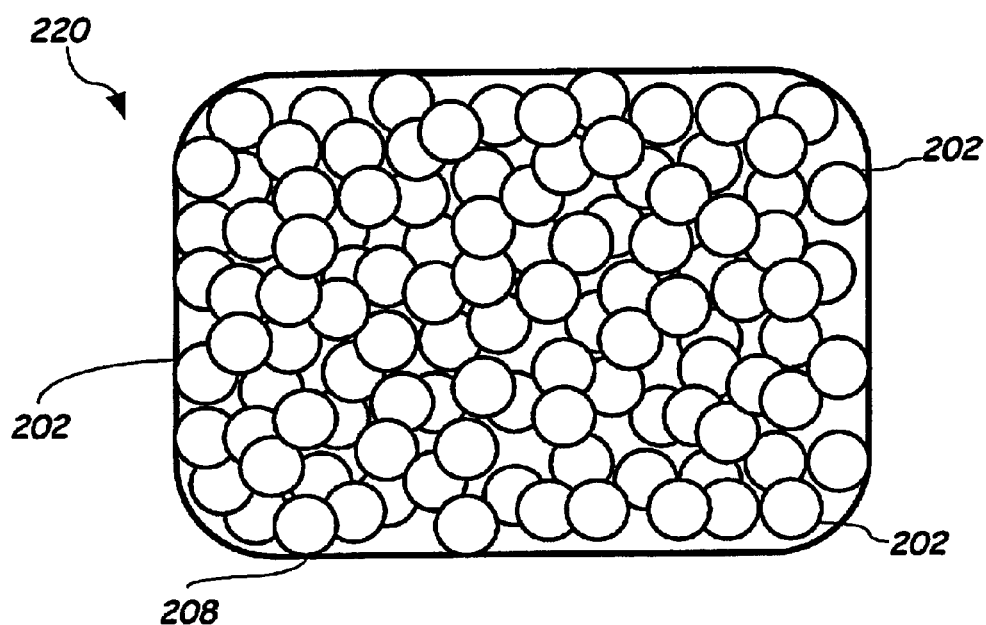
FIG. 2B is a depiction of an embodiment of the present invention wherein a top view of plurality of items is included in a composition to provide a desired EMC characteristic.

For example, as shown in the exemplary embodiment 220 depicted in FIG. 2B, a plurality of items in accordance with the present invention may be included in an adhesive to provide a desired EMC characteristic. In this instance, a sufficient quantity of items 202 is included in an adhesive 208 to provide EMC shielding characteristic. The items are provided in sufficient quantity to give a substantially continuous dispersion. The result of which, is that when the items 202 are formed of an EMC shielding material, the items 202 may provide shielding characteristics to the computer chip 104 (FIG. 1) as well as to components surrounding the computer chip. For instance, the chip may both be protected from outside influences as well as protecting components surrounding the chip from the chip's influence.

Figure 2C:
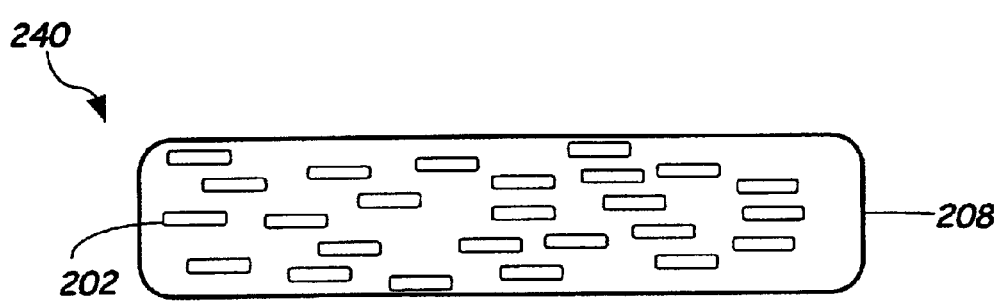
FIG. 2C is an exemplary side view of the embodiment depicted in FIG. 2B wherein items are layered to provide additional and consistent protection.

From a side view of an adhesive, as shown in the embodiment 240 depicted in FIG. 2C, items 202 may be layered to provide additional and consistent protection. For instance, by having the items 202 overlap, as shown in FIGS. 2B and 2C, continuous EMC shielding may be provided.

Additionally, the items may be formed so as to orient themselves between components to provide desired EMC characteristics. For example, an item 202 may be formed to have its longest dimension, i.e. length 204 (FIG. 2A), have a range of approximately equal to or less than one-half the distance between the heat sink 105 and the computer chip 104 and equal to or greater than one-quarter of the distance between the heat sink 106 and the computer chip 104. Further the smallest average dimension 206, i.e. thickness, of the item 202 is at least one of equal to or less than one-tenth of the distance between the components. In this way, a generally average orientation of the items 202 in the adhesive 208 may be achieved which is generally parallel to component surfaces.

Figure 3A:
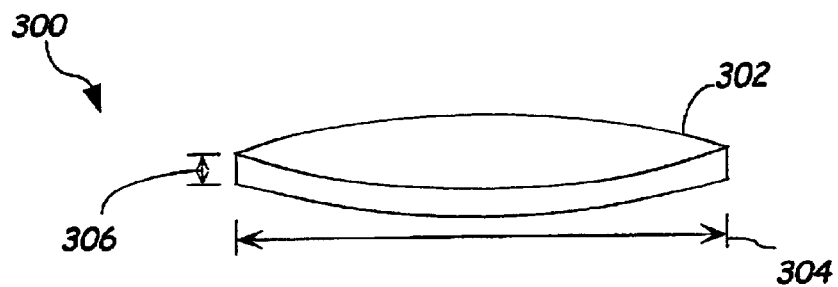
FIG. 3A is an illustration of an exemplary embodiments of the present invention wherein an item formed as a sliver provides desired EMC characteristics.
Figure 3B:
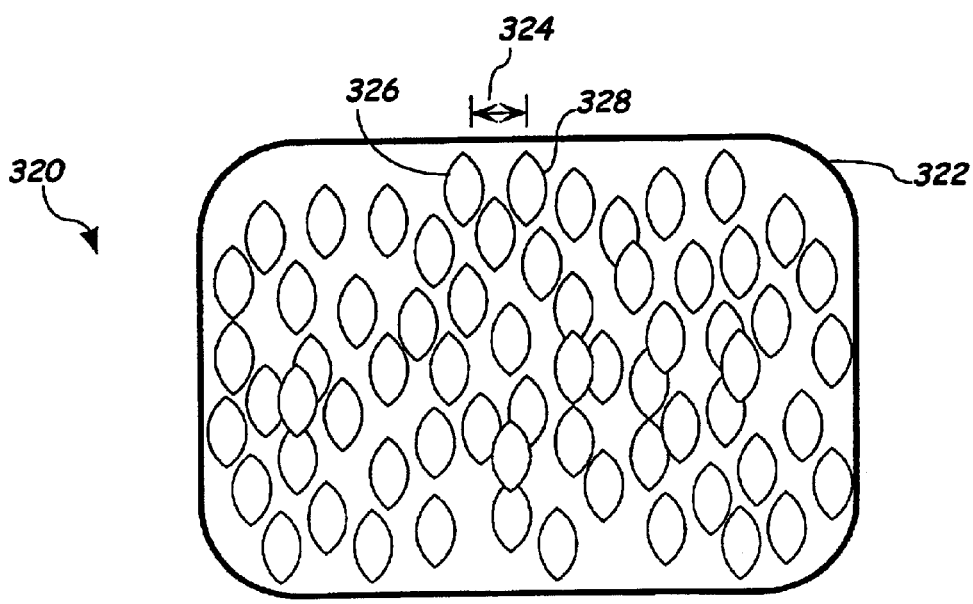
FIG. 3B is a top view of an embodiment of the present invention wherein a plurality of items as shown in FIG. 3B are configured in a cohesively oriented arrangement.
Figure 3C:
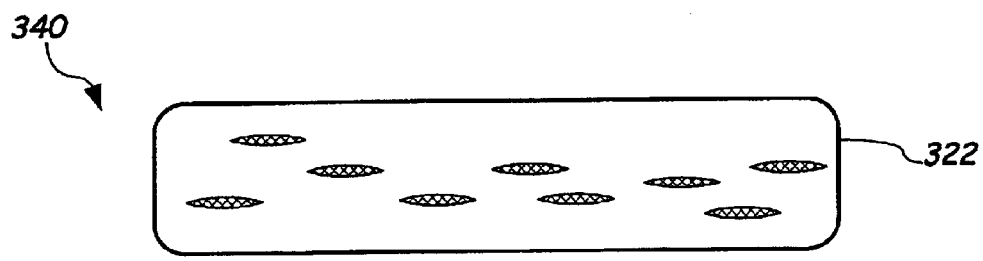
FIG. 3C is an exemplary side view of the embodiment depicted in 3B wherein items are layered and oriented in a generally cohesively oriented.

Referring now to FIGS. 3A, 3B and 3C, exemplary embodiments 300, 320 and 340 of the present invention are shown wherein an item formed as a sliver provides desired EMC characteristics. A sliver 302, as shown in FIG. 3A, may be formed as in the previous example so that the sliver 302 may be included in an adhesive to provide EMC shielding characteristics. The sliver 302 has a length 304 of approximately one to one-half the distance between the desired components. In additional embodiments, the sliver 302 may be configured to have a length of at least the distance between the components, e.g. the thickness of the adhesive. For example, by providing an item with a length of generally equal to or greater than the distance between the components, the likelihood of a generally parallel orientation of the items in the adhesive may be increased.

Additionally, the thickness, such as the average smallest dimension of the item in a given orientation, is sufficient to allow the item to float in the adhesive, as shown in the embodiment 340 depicted in FIG. 3C. In this way, the likelihood of contact by an item between the components to which the adhesive is adhering is reduced, which may be preferable in situations in which electrical conductivity between components is not desired.

Referring again to FIGS. 3B and 3C, embodiments 320 and 340 of the present invention are shown wherein items of the present invention are oriented in a carrier material to provide a desired EMC characteristic. Items of the present invention may be cohesively oriented to provide a desired EMC characteristic. For example, items 302 may be included in an adhesive 322 in a particular orientation to provide a desired level of shielding. In FIGS. 3A and 3B, items are uniformly oriented to provide an average gap 324 between a first item 326 and a second item 328. Although, in certain contemplated embodiments, the gap between each individual item may not be exactly uniform, by providing an average gap distance, both side to side as shown in FIG. 3B as well as depth as shown in FIG. 3C, over the entirety of the carrier material, in this instance the adhesive 322, desired shielding may be provided. Thus, although shielding is provided by the items, the amount of shielding may be varied depending on the size, orientation and quantity of the items to give the desired result.

Figure 4A:
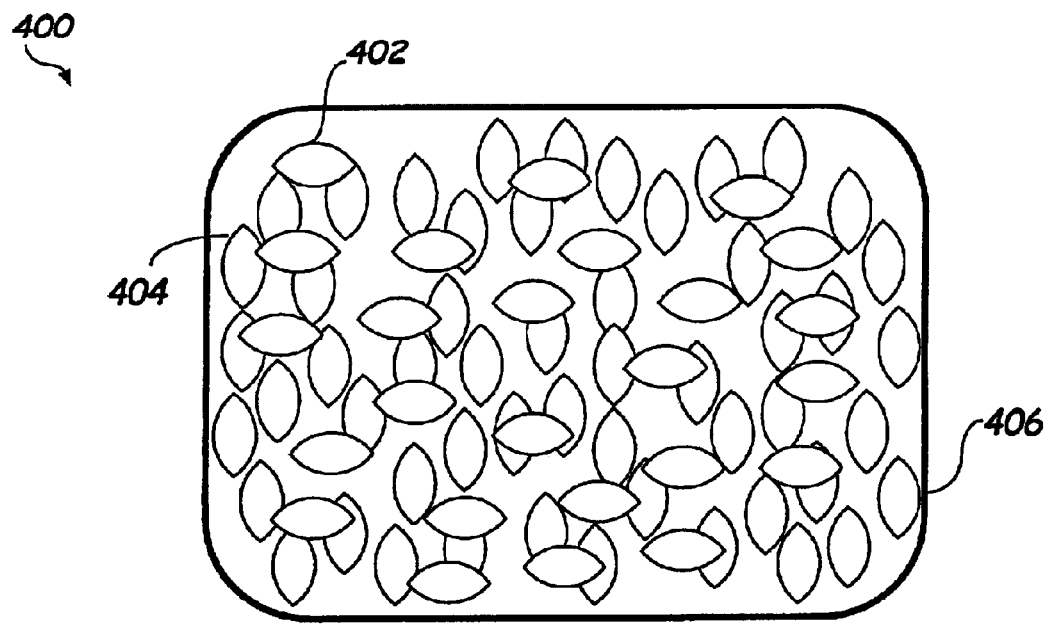
FIG. 4A is an illustration of an embodiment of the present invention wherein items disposed in a carrier material are oriented in an orthogonal relationship to provide a desired EMC characteristic.
Figure 4B:
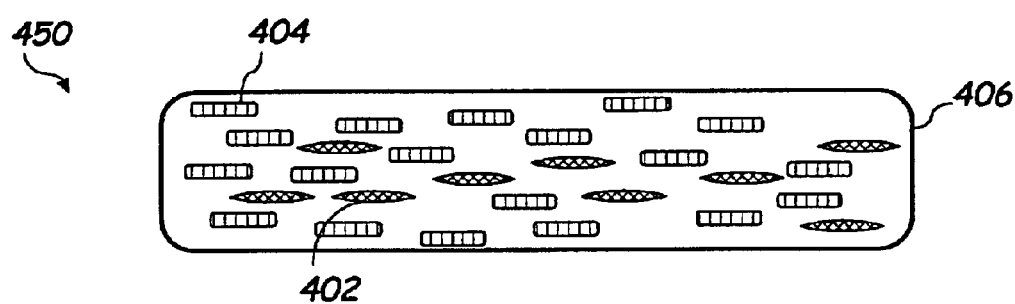
FIG. 4B is a side view of the exemplary embodiment depicted in FIG. 4A.
Figure 5A:
FIGS. 5A, 5B, 5C, 5D, 5E, 5F & 5G are illustration of shapes of exemplary items suitable for being employed by the present invention.
Figure 5B:
Figure 5C:
Figure 5D:
Figure 5E:
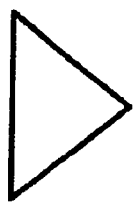
Figure 5F:
Figure 5G:

For example, referring now to FIGS. 4A and 4B, embodiments 400 and 450 of the present invention are shown wherein items disposed in a carrier material are oriented in an orthogonal relationship to provide a desired EMC characteristic. In this instance, slivers are arranged in a first orientation 402 and a second orientation 404 in a carrier material. The first orientation 402 is generally orthogonal to the second orientation 404. Such an arrangement may be preferable when utilizing items that do not have a generally uniform length to provide substantially uniform coverage as desired by a person of ordinary skill in the art. Additionally, is should be apparent to a person of ordinary skill in the art that a variety of orientations, such as random and the like, are contemplated by the present invention without departing from the spirit and scope thereof.

Referring now to FIGS. 5A through 5G, exemplary items as contemplated by the present invention are shown. Items of the present invention may have a variety of shapes, lengths and thicknesses without departing from the spirit and scope of the present invention. As contemplated by a person of ordinary skill in the art, shape of items of the present invention may be varied depending on the desired characteristic. For example, shapes may be selected to promote uniform dispersion by selecting shapes that promote overlapping. Shapes may also be selected to promote gaps between items to provide less shielding, and the like. Additionally, shaped may be selected to promote lower contact between components by the items, such as by being formed in a three-dimensional manner so that items have a lower contact area, such as curved, a plurality of points, and the like.

It is believed that the items for providing EMC characteristics of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An adhesive suitable to provide a bond between components, comprising:

an adhering material suitable for holding a first surface and a second surface in contact; and a plurality of items disposed in the adhering material, the plurality of items having electromagnetic capability (EMC) shielding characteristics, wherein an item of the plurality of items includes a ceramic ferromagnetic material and a Mu metal.

2. The adhesive as described in claim 1, wherein the ceramic ferromagnetic material includes ferrite.

3. The adhesive as described in claim 1, wherein a quantity of the plurality of items disposed in the adhering material is sufficient to provide EMC shielding between the first surface and the second surface.

4. The adhesive as described in claim 1, wherein the first surface is included on an integrated circuit and the second surface is included on a heat sink.

5. The adhesive as described in claim 1, wherein items of the plurality of items are shaped to include at least one of a disk, sliver, hexagonal, triangular, parallelogram, oval, diamond, polyhedral and polymorphic.

6. An adhesive suitable to provide a bond between components, comprising:

an adhering material suitable for holding a first surface and a second surface in contact; and a plurality of items disposed in the adhering material, the plurality of items having electromagnetic capability (EMC) shielding characteristics, wherein an item of the plurality of items includes a ceramic ferromagnetic material and a Mu metal and is formed wherein a longest dimension of the item is at least one of equal to and less than one-half of a distance between the first surface and the second surface.

7. The adhesive as described in claim 6, wherein an item of the plurality of items is formed wherein a longest dimension of the item is at least one of equal to and greater than one-quarter of a distance between the first surface and the second surface.

8. The adhesive as described in claim 6, wherein an item of the plurality of items is formed wherein a longest dimension of the item is at least one of equal to and less than one-quarter of a distance between the first surface and the second surface.

9. An adhesive suitable to provide a bond between components, comprising:

an adhering material suitable for holding a first surface and a second surface in contact; and a plurality of items disposed in the adhering material, the plurality of items having electromagnetic capability (EMC) shielding characteristics, wherein an item of the plurality of items includes a ceramic ferromagnetic material and a Mu metal and is formed wherein a smallest dimension of the item is at least one of equal to and less than one-tenth of a distance between the first surface and the second surface.

10. An adhesive suitable to provide a bond between components, comprising:

an adhering material suitable for holding a first surface and a second surface in contact; and a plurality of items disposed in the adhering material, the plurality of items having electromagnetic capability (EMC) shielding characteristics, wherein an item of the plurality of items includes a ceramic ferromagnetic material and a Mu metal and is formed wherein a midpoint width of the item is at least one of equal to and less than one-quarter of a distance between the first surface and the second surface.

11. An electrical system, comprising:
   a first electrical component suitable for providing a function, the first electrical component including a first surface;
   a second component suitable for providing a function, the second component including a second surface;
   an adhering material suitable for holding the first surface of the first electrical component and a second surface of the second component in contact; and
   a plurality of items disposed in the adhering material, the plurality of items having electromagnetic capability (EMC) shielding characteristics, wherein an item of the plurality of items includes a ceramic ferromagnetic material and a Mu metal.

12. The electrical system as described in claim 11, wherein the ceramic ferromagnetic material includes ferrite.

13. The electrical system as described in claim 11, wherein a quantity of the plurality of items disposed in the adhering material is sufficient to provide EMC shielding between the first electrical component and the heat sink.

14. The electrical system as described in claim 11, wherein the first electrical component is an integrated circuit and the second component is a heat sink.

15. The electrical system as described in claim 11, wherein items of the plurality of items are shaped to include at least one of a disk, sliver, hexagonal, triangular, parallelogram, oval, diamond, polyhedral and polymorphic.

16. An electrical system, comprising:
   a first electrical component suitable for providing a function, the first electrical component including a first surface;
   a second component suitable for providing a function, the second component including a second surface;
   an adhering material suitable for holding the first surface of the first electrical component and a second surface of the second component in contact; and
   a plurality of items disposed in the adhering material, the plurality of items having electromagnetic capability (EMC) shielding characteristics, wherein an item of the plurality of items includes a ceramic ferromagnetic material and a Mu metal and is formed wherein a longest dimension of the item is at least one of equal to and less than one-half of a distance between the first surface and the second surface.

17. The electrical system of claim 16, wherein an item of the plurality of items is formed wherein a longest dimension of the item is at least one of equal to and greater than one-quarter of a distance between the first surface and the second surface.

18. The electrical system of claim 16, wherein an item of the plurality of items is formed wherein a longest dimension of the item is at least one of equal to and greater than one-tenth of a distance between the first surface and the second surface.

19. An electrical system, comprising:
   a first electrical component suitable for providing a function, the first electrical component including a first surface;
   a second component suitable for providing a function, the second component including a second surface;
   an adhering material suitable for holding the first surface of the first electrical component and a second surface of the second component in contact; and
   a plurality of items disposed in the adhering material, the plurality of items having electromagnetic capability (EMC) shielding characteristics, wherein an item of the plurality of items includes a ceramic ferromagnetic material and a Mu metal and is formed wherein a smallest dimension of the item is at least one of equal to and less than one-tenth of a distance between the first surface and the second surface.

20. An electrical system, comprising:
   a first electrical component suitable for providing a function, the first electrical component including a first surface;
   a second component suitable for providing a function, the second component including a second surface;
   an adhering material suitable for holding the first surface of the first electrical component and a second surface of the second component in contact; and
   a plurality of items disposed in the adhering material, the plurality of items having electromagnetic capability (EMC) shielding characteristics, wherein an item of the plurality of items includes a ceramic ferromagnetic material and a Mu metal and is formed wherein a midpoint width of the item is at least one of equal to and less than one-quarter of a distance between the first surface and the second surface.

21. An electrical system, comprising:
   a first electrical component suitable for providing a function, the electrical component including a first surface;
   a second component including a second surface;
   a carrier material disposed between the first electrical component and the second component; and
   a plurality of items disposed in the carrier material, the plurality of items having electromagnetic capability (EMC) shielding characteristics, wherein an item of the plurality of items includes a ceramic ferromagnetic material and a Mu metal.

22. The electrical system as described in claim 21, wherein the plurality of items are formed having a length between 3 microns and 1 millimeter.

23. The electrical system as described in claim 21, wherein the carrier material is thermally conductive.

* * * * *